United States Patent [19]

Hayakawa et al.

[11] Patent Number: 4,746,181

[45] Date of Patent: May 24, 1988

[54] OPTICAL SEMICONDUCTOR DEVICE

[75] Inventors: Toshiro Hayakawa; Takahiro Suyama; Saburo Yamamoto, all of Nara, Japan

[73] Assignee: Sharp Kabushiki Kaisha, Osaka, Japan

[21] Appl. No.: 746,710

[22] Filed: Jun. 20, 1985

[30] Foreign Application Priority Data

Jun. 25, 1984 [JP] Japan ................. 59-132194

[51] Int. Cl.$^4$ ............................................. G02B 6/10
[52] U.S. Cl. ............................................. 350/96.12
[58] Field of Search ................. 350/96.12; 357/85, 88

[56] References Cited

U.S. PATENT DOCUMENTS 4,261,771  4/1981  Dingle et al. ............ 357/16

OTHER PUBLICATIONS

"Dynamic Behavoir of a GAAsAIGeAsMQW Laser Diode"; *Electronic Letters;* Vol. 19, No. 5; Mar. 1983, pp 180–181.
"Superlattic Optical-Cavity NQW Lasers"; *Electronic Letters;* Vol. 20, No. 8; Apr. 1984; pp 320–322.
"All Binary Al As-Ga As Laser Diode"; *IEEE Electron Device Letters;* Vol. E DL-4, No. 7; Jul. 1983; pp. 212–214.

PUBLICATIONS

Tokuda et al.; J. Appl. Phys.; vol. 60; pp. 2729–2734; 1986.
Tsang; Appl. Phys. Lett.; vol. 39; pp. 786–788; 1981.
Yasunori Tokuda et al., J. Appl. Phys., vol. 60, pp. 2729–2734 (1986).
W. T. Tsang, Appl. Phys. Lett., vol. 39, pp. 786–788 (1981).
N. K. Dutta, J. Appl. Phys., vol. 53, pp. 7211–7214 (1982).
H. Iwamura, Electronics Letters, vol. 19, pp. 180–181 (1983).

*Primary Examiner*—William L. Sikes
*Assistant Examiner*—Robert E. Wise
*Attorney, Agent, or Firm*—Spencer & Frank

[57] ABSTRACT

An optical semiconductor device comprising laminated thin layers made of two kinds of binary compounds to form a superlatticed optical waveguiding structure and a superlatticed active region structure, thereby achieving a quantum well effect.

5 Claims, 3 Drawing Sheets

AlAs Mole Fraction x
in $Ga_{1-x}Al_xAs$ Mixed Crystal

AlAs Mole Fraction x
in $Ga_{1-x}Al_xAs$ Mixed Crystal

OPTICAL SEMICONDUCTOR DEVICE

BACKGROUND OF THE INVENTION

1. Field of the Invention

This invention relates to an optical semiconductor device such as a quantum well laser, a quantum well light-modulator, a quantum well optical-waveguiding circuit, etc., which contains a quantum well optical-waveguiding region, utilizing a quantum effect within semiconductor thin films formed by molecular beam epitaxy (MBE), metal-organic chemical vapor deposition (MO-CVD), etc.

2. Description of the Prior Art

Recently, a single crystal growth technique for the formation of thin films such as molecular beam epitaxy (MBE), metal-organic chemical vapor deposition (MO-CVD), etc., has been developed which enables the formation of thin film growth layers having a thickness of as thin as appoximately 10 Å. The development of such a technique, although these significantly thin films have not yet been produced by liquid phase epitaxy (LPE), allowed the thin films to be applied to lasers, resulting in laser devices exhibiting new laser effects. A typical example of these new laser devices is a quantum well (QW) laser, which is produced based on the fact that quantization levels are established in its active layer by reducing the thickness of the active layer from several hundred Å to approximately 100 Å or less and which is advantageous over conventional double-heterostructure lasers in that the threshold current level is low and the temperature and transient characteristics are superior. Such a quantum well laser is described in detail in the following papers:

(1) W. T. Tsang, Applied Physics Letters, vol. 39, No. 10, pp. 786 (1981)
(2) N. K. Dutta, Journal of Applied Physics, vol. 53, No. 11, pp. 7211 (1982), and
(3) H. Iwamura, T. Saku, T. Ishibashi, K. Otuka, Y. Horikoshi, Electronics Letters, vol. 19, No. 5, pp. 780 (1983).

As mentioned above, a single crystal growth technique, such as molecular beam epitaxy or metal-organic chemical vapor deposition, has resulted in the practical use of high quality semiconductor lasers having a new multiple-layered structure.

FIG. 2 shows a conventional laminated structure of a single quantum well laser, having carrier reservoir layers, which is made by the successive growth of an n-GaAs buffer layer 2 having a thickness of 0.5 μm, an n-$Ga_{0.5}Al_{0.5}As$ cladding layer 3 having a thickness of 1 μm, a non-doped $Ga_{0.7}Al_{0.3}As$ carrier reservoir layer 4 having a thickness of 0.1 μm, a non-doped GaAs quantum well active layer 5 having a thickness of 0.01 μm, a non-doped $Ga_{0.7}Al_{0.3}As$ carrier reservoir layer 6 having a thickness of 0.1 μm, a p-$Ga_{0.5}Al_{0.5}As$ cladding layer 7 having a thickness of 1 μm and a p-GaAs cap layer 8 having a thickness of 0.3 μm on an n-GaAs substrate 1 by molecular beam epitaxy. FIG. 3 shows the distribution of the AlAs mole fraction (i.e., x) in a $Ga_{1-x}Al_xAs$ mixed crystal in the laminated structure in FIG. 2, which is composed of the cladding layers 3 and 7, the carrier reservoir layers 4 and 6, and the active layer 5. Laser oscillation is achieved in a GaAs quantum well active layer 5 having the low AlAs mole fraction (i.e., x) in a $Ga_{1-x}Al_xAs$ mixed crystal. This active layer 5 has a thickness of 0.01 μm which is optically thin enough compared with the wavelength of light, so that its existence is optically negligible. Thus, the waveguiding of light therein is carried out by an optical waveguide which is formed by the carrier reservoir layers 4 and 6 and the cladding layers 3 and 7. The laser oscillation in the above-mentioned laser structure is attained depending upon the quantization levels which are established in the single quantum well active layer 5. The active layer 5 is extremely thin and sandwiched between the carrier reservoir layers 4 and 6 having a great energy gap therebetween. The quantization levels are produced due to steep changes in the energy gap at the interface between the quantum well growth layers, and thus composition of the active layer 5 is required to be dramatically different from that of each of the carrier reservoir layers 4 and 6. However, since the composition of the interface between the quantum well growth layers in the conventional laser structure shown in FIG. 2 is a GaAlAs ternary mixed crystal, microscopical arrangements of Ga and Al in a direction which is parallel to the interface between the growth layers are not uniform and/or irregular so that steep changes in the energy gap at the interface between the growth layers cannot be attained and swayed changes therein are created. This is the reason why ideal quantum well characteristics have not yet been attained in the quantum well structure.

As the quantum well structure, in addition to the single quantum well mentioned above, a multi-quantum well having the AlAs mole fraction (i.e., x) in a $Ga_{1-x}Al_xAs$ mixed crystal as shown in FIG. 4 has been used, which is made in such a manner that a multi-quantum well structure which is composed of alternate layers consisting of five GaAs quantum well active layers (the thickness of each layer being 0.01 μm) 12 and four $Ga_{0.7}Al_{0.3}As$ barrier layers (the thickness of each layer being 0.005 μm) 13, is sandwiched between $Ga_{0.7}Al_{0.3}As$ cladding layers 11 and 11. According to the multi-quantum well structure, the average AlAs mole fraction (i.e., x) in a $Ga_{1-x}Al_xAs$ mixed crystal of the quantum well consisting of the active layer 12 and the barrier layer 13 is approximately 0.086, which is smaller than that of $Ga_{0.7}Al_{0.3}As$, and moreover the thickness of the quantum well region is as thick as 0.07 μm, so that the multi-quantum well structure can serve as an optical waveguide. Moreover, an increase in the number of both the quantum well active layers 12 and the barrier layers 13 allows an increase in the proportion of light to be waveguided in the quantum well. Thus, the application of a multi-quantum well to an optical waveguiding device (such as an optical waveguide, an optical switch, a light modulator, etc.,) employing the Exitonic efect which is specific to quantum well structures is advantageous over that of a single quantum well thereto. However, if such ternary mixed crystal as GaAlAs were used for the barrier layers 13 and/or the cladding layers 11 in the multi-quantum well structure, the swayed changes in the energy gap at the interface between the growth layers would have a decremental influence upon the resulting multi-quantum well optical waveguide.

SUMMARY OF THE INVENTION

The optical semiconductor device of this invention which overcomes the above-discussed disadvantages and other numerous drawbacks and deficiencies of the prior art, comprises laminated thin layers made of two kinds of binary compounds to form a superlatticed optical waveguiding structure and a superlatticed active region structure, thereby achieving a quantum well effect.

The two kinds of binary compounds are, in a preferred embodiment, GaAs and AlAs, GaSb and AlSb, InAs and AlAs, or InP and GaP.

The thin layers are, in a preferred embodiment, successively grown to form a laminated structure by molecular beam epitaxy or metal-organic chemical vapor deposition.

Thus, the invention described herein makes possible the objects of (1) providing an optical semiconductor device which does not have swayed changes in the energy gap at the interface between the growth layers, but has an ideal quantum well optical-waveguide structure; and providing an optical semiconductor device such as a quantum well laser, a quantum well optical-waveguiding circuit, etc., which has characteristics attaining an excellent quantum effect without undergoing a decremental effect (i.e., a decrease of the quantum effect) resulting from the non-uniformity and/or the irregularity of the composition in the interface between the growth layers.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
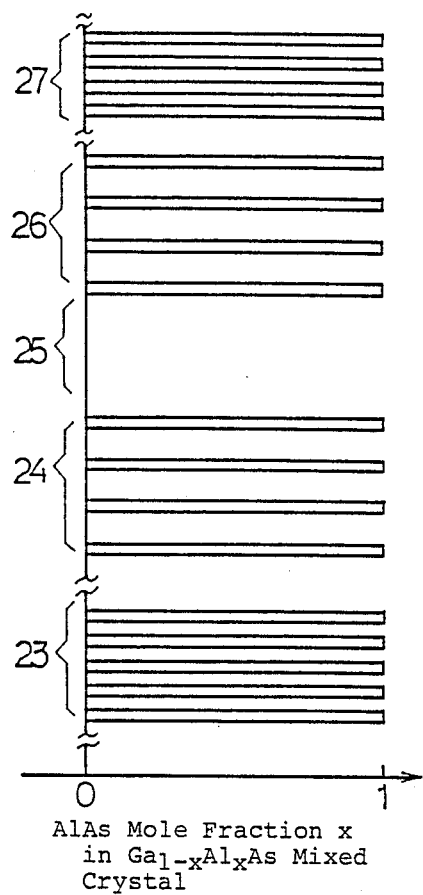
FIG. 1 shows a distribution of the Al mode fraction in a single quantum well semiconductor laser according to this invention.

FIG. 1 shows a distribution of the Al mole fraction in a semiconductor laser device having a quantum well structure according to this invention, which consists of binary compounds alone (e.g., GaAs and AlAs) having the Al component ratios of 0 and 1, respectively, and contains no ternary mixed crystal.

Figure 2:
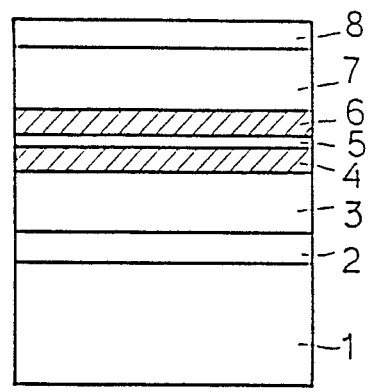
FIG. 2 is a sectional view showing the structure of a conventional single quantum well semiconductor laser.
Figure 3:
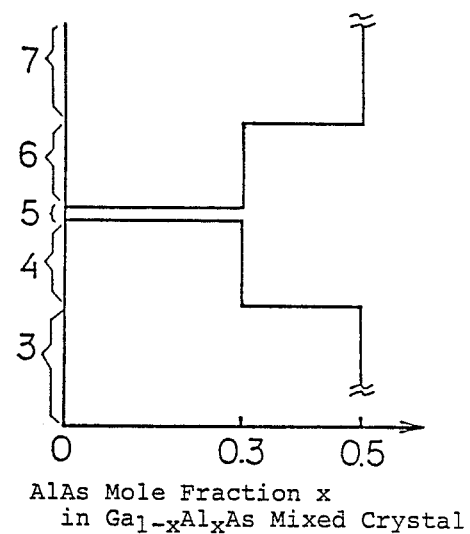
FIG. 3 is a schematic illustration showing the distribution of the AlAs mole fraction (i.e., x) in a $GA_{1-x}Al_xAs$ mixed crystal in the quantum well laser in FIG. 2.
Figure 6:
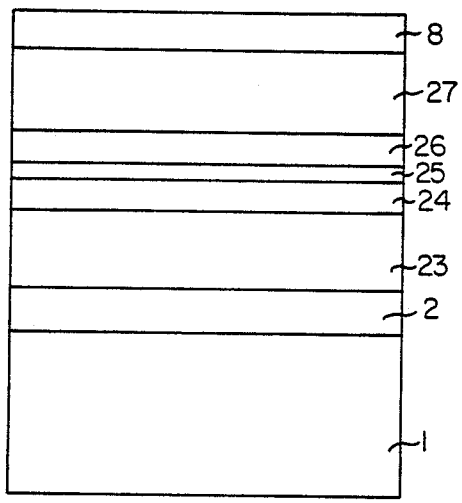
FIG. 6 shows a sectional view of the quantum well laser of FIG. 1.

The device is produced, in the same manner as in that shown in FIG. 2, as follows:

On an n-GaAs substrate 1, an n-GaAs buffer layer 2 having a thickness of 0.5 μm is grown. Then, on the n-GaAs buffer layer 2, as shown in FIGS. 1 and 6, a superlatticed cladding layer 23 which is composed of alternate layers consisting of five hundred n-GaAs layers (the thickness of each layer being 10 Å) and five hundred n-AlAs layers (the thickness of each layer being 10 Å), a superlatticed optical guiding layer 24 which is composed of alternate layers consisting of thirty non-doped GaAs layers (the thickness of each layer being 25 Å) and thirty non-doped AlAs layers (the thickness of each layer being 10 Å), a non-doped GaAs quantum well active layer (the thickness thereof is 100 Å) 25, a superlatticed optical guiding layer 26 which is composed of alternate layers consisting of thrity non-doped GaAs layers (the thickness of each layer being 25 Å) and thirty non-doped AlAs layers (the thickness of each layer being 10 Å), a superlatticed cladding layer 27 which is composed of alternate layers consisting of five hundred p-GaAs layers (the thickness of each layer being 10 Å) and five hundred p-AlAs layers (the thickness of each layer being 10 Å), and a p-GaAs cap layer 8 (the thickness thereof being 0.3 μm) are successively grown by molecular beam epitaxy or metal-organic chemical vapor deposition, which enables the formation of remarkably thin film growth layers as mentioned above. The equivalent mixed crystal ratio of the Al component to the GaAl component in each of the superlatticed cladding layers 23 and 27 is 0.5 which is greater than approximately 0.29 in each of the superlatticed optical guiding layers 24 and 26, resulting in an optical waveguiding structure which is equivalent to that in FIG. 3 and through which light can be effectively waveguided to the active layer 25. No ternary mixed crystal is contained in the optical guiding layers 24 and 26 having a significant influence on the establishment of quantization levels in the active layer 25, resulting in unswayed changes in the energy gap at the interface between the active layer 25 and each of the optical guiding layers 24 and 26, thereby attaining an excellent quantum effect. Moreover, the difference in composition between the active layer 25 and each of the optical guiding layers 24 and 26 is so great that a steep energy gap therebetween can be created. In the case where the AlAs layers are grown by molecular beam epitaxy, there is a fear of the decrease in crystalization thereof due to the reaction of an Al molecular beam with residual oxygen, etc. However, since the thickness of each of the resulting AlAs layers is, in fact, as thin as 10 Å, as mentioned above, according to this invention, the growth of each of the AlAs layers can be completed in as short as approximately several seconds, resulting in a superlatticed crystalline layer which is the same as that formed at the time when an Al molecular beam is uniformly radiated for the growth of a mixed crystal.

Then, an n-metal electrode and a p-metal electrode are formed on the bottom of the n-GaAs substrate 1 and the p-cap layer 8, respectively, by a vacuum evaporation technique, resulting in a double-heterostructure laser device having a superlatticed structure and, as desired, a striped structure for contracting an injected current thereby.

When an electric current is injected into the resulting laser device through the n- and the p- electrode electrodes, a light is waveguided due to the superlatticed structure and carriers are confined within the active layer 25 to thereby begin the laser oscillation operation. The light is waveguided to the region of each of the optical guiding layers 24 and 26 and is sufficiently amplified by a resonator in the laser device, resulting in the emission of a laser light from a facet meeting the inductive emission requirements. The optical guiding layers 24 and 26 serve to suppress an excessive increase in the optical density in the active layer 25, thereby maintaining stabilized laser oscillation. The laser device in this Example attains laser oscillation at a low threshold current level and produces a laser light having a high output power, and moreover, it exhibits excellent quantum well characteristics, thereby allowing the application thereof to the fields of information processing, light communication, measuring, etc., as a laser device attaining a stabilized output operation and having great practical value.

Figure 4:
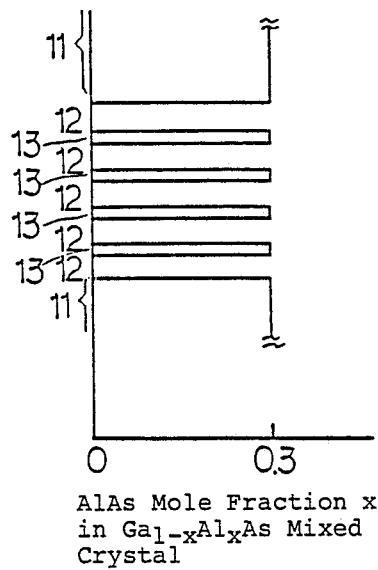
FIG. 4 shows a distribution of the AlAs mole fraction (i.e., x) in a $Ga_{1-x}Al_xAs$ mixed crystal in a conventional multi-quantum well optical-waveguide.
Figure 5:
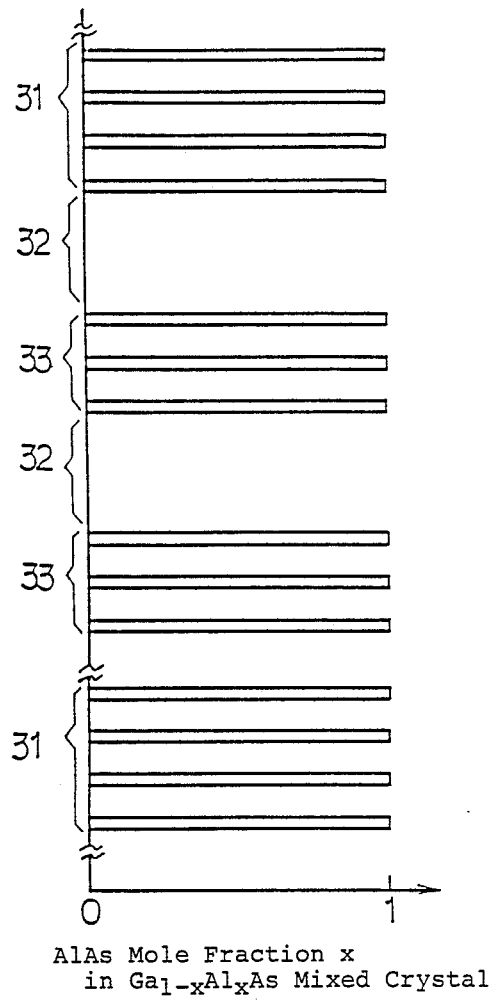
FIG. 5 shows a distribution of the AlAs mole fraction (i.e., x) in a $Ga_{1-x}Al_xAs$ mixed crystal in a multi-quantum well optical guide laser according to this invention.

FIG. 5 shows the distribution of the Al mode fraction in an optical waveguide structure in another multi-quantum well optical waveguide of this invention. The optical waveguide structure comprises alternate layers consisting of five GaAs quantum well active layers (the thickness of each layer being 100 Å) 32 and four barrier layers 33, and two superlatticed cladding layers 31 sandwiching the alternate layers therebetween. Each of the barrier layers 33 is composed of alternate layers consisting of two GaAs layers (the thickness of each layer being 25 Å) and three AlAs layers (the thickness of each layer being 10 Å). Each of the superlatticed cladding layers 31 is composed of alternate layers consisting of five hundred GaAs layers (the thickness of each layer being 25 Å) and five hundred AlAs layers (the thickness of each layer being 10 Å). Although the optical waveguide structure functions in the same manner as that in the conventional optical waveguide having a multi-quantum well structure in FIG. 4, the qunatum effect attained thereby is superior to that of conventional optical waveguide since the optical waveguide structure of this invention creates no swayed changes in the energy gap at the interface between the growth layers each of which is composed of binary compounds.

The quantum well lasers and optical waveguides in the above-mentioned Examples of this invention are composed of two kinds of binary compounds such as GaAs and AlAs, but are not limited thereto. As the binary compounds, semiconductor substances such as GaSb and AlSb, InAs and AlAs, InP and GaP, etc., can be also used for this invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. An optical semiconductor device comprising an active region confined by optical waveguiding structures, wherein each of said optical waveguiding structures is a superlattice layer in which layers of a first binary compound are alternately stacked with layers of a second binary compound, said first and second binary compounds having one common element.

2. An optical semiconductor device according to claim 1, wherein said two kinds of binary compounds are GaAs and AlAs, GaSb and AlSb, InAs and AlAs, or InP and GaP.

3. An optical semiconductor device according to claim 1, wherein said alternative layers are successively grown to form a laminated structure by molecular beam epitaxy or metal-organic chemical vapor deposition.

4. An optical semiconductor device according to claim 1, wherein said active region includes an active layer sandwiched by two optical guide layers, each of said two optical guide layers being a superlattice layer in which layers of said binary compound are alternately stacked with layers of said second binary compound, thereby forming a single-quantum well structure.

5. An optical semiconductor device according to claim 1, wherein said active region includes an alternate lamination of active layers and barrier layers, each of said barrier layers being another alternate lamination in which layers of said first binary compound are alternately stacked with layers of said second binary compound, thereby forming a multi-quantum well structure.

* * * * *